United States Patent [19]

Takafuji et al.

[11] Patent Number: 4,720,736
[45] Date of Patent: Jan. 19, 1988

[54] AMORPHOUS SILICON THIN FILM TRANSISTOR

[75] Inventors: Yutaka Takafuji; Kohei Kishi, both of Nara; Hirohisa Tanaka, Gose, all of Japan

[73] Assignee: Sharp Kabushiki Kaisha, Osaka, Japan

[21] Appl. No.: 821,457

[22] Filed: Jan. 22, 1986

[30] Foreign Application Priority Data

Jan. 24, 1985 [JP] Japan ................... 60-11905

[51] Int. Cl.⁴ ........................... H01L 29/78
[52] U.S. Cl. .................... 357/23.7; 357/59; 357/2; 357/55
[58] Field of Search ............. 357/23.7, 2, 59, 4, 357/59 B, 59 E, 52, 23, 14, 59 R, 55

[56] References Cited

U.S. PATENT DOCUMENTS

| 4,040,073 | 8/1977 | Luo | 357/4 |
| 4,425,572 | 1/1984 | Takafuji et al. | 357/23.7 |
| 4,514,253 | 4/1985 | Minezaki | 357/4 |
| 4,532,536 | 7/1985 | Hatanaka et al. | 357/59 B X |
| 4,609,930 | 9/1986 | Yamazaki | 357/23.7 |

FOREIGN PATENT DOCUMENTS

| 0139585 | 5/1985 | European Pat. Off. | |
| 57-90977 | 6/1982 | Japan | 357/23.7 |
| 57-204168 | 12/1982 | Japan | 357/23.7 |
| 58-115850 | 7/1983 | Japan | 357/23.7 |

OTHER PUBLICATIONS

Chenvas-Paule et al., "Self Aligned a-SI:H TFT: A New Way to Design Active-Matrix LCDs", Proc. SID, vol. 26/3.
Patent Abstracts of Japan, 1984, vol. 8, No. 70, English Disclosure of JP No. 58-21869.

Primary Examiner—Martin H. Edlow
Assistant Examiner—William A. Mintel
Attorney, Agent, or Firm—Birch, Stewart, Kolasch & Birch

[57] ABSTRACT

A thin film transistor includes: a gate electrode formed on an insulating substrate; a first insulating film for covering the gate electrode; a first conducting semiconductor film formed on the first insulating film; a second insulating film for covering the entire top surface of the semiconductor film; a pair of second conducting semiconductor layers formed, spaced from each other, in contact with the side surfaces of the semiconductor film; and first and second electrodes formed in contact with the pair of second conducting semiconductor layers, respectively. Current flows only on the sides of the semiconductor film and through the second conducting semiconductor layers.

6 Claims, 9 Drawing Figures

AMORPHOUS SILICON THIN FILM TRANSISTOR

BACKGROUND OF THE INVENTION

1. Field of the Invention

The present invention relates to the structure of a field effect thin film transistor (hereinafter referred to as TFT), and more specifically to the structure of a TFT using amorphous silicon as a semiconductor layer in which the resistance at source and drain electrodes is small and in which leakage current by response of minority carriers is small in the OFF state.

2. Description of the Prior Art

Conventional TFT structure is described below. FIGS. 1 through 3 shown cross sections of conventional TFT structure, in which a gate electrode 20, 21, 22 is formed on an insulating substrate 10, 11, 12 and gate insulating film 30, 31, 32 is formed to cover the gate electrode 20, 21, 22. For the TFT structure shown in FIG. 1, a non-doped amorphous silicon film 40 is then formed over the entire surface of the gate insulating film 30. For the TFT shown in FIG. 2, a non-doped amorphous silicon film 41 is formed on the central portion of the gate insulating film 31. Then, metal films are formed thereon over the respective end portions of the gate electrode 20, 21 to define a source electrode 50, 51 and a drain electrode 60, 61. For the TFT shown in FIG. 3, n+ amorphous silicon film 72, 82 is formed each on both end portions of the gate insulating film 32. Then, source and drain electrodes 52, 62 are formed on the n+ amorphous silicon film 72, 82, and finally a non-doped amorphous silicon film 42 is formed in the center on the gate insulating film 32 and on the electrodes 52, 62.

In a TFT with the structure shown in FIG. 1, when the TFT is ON, a current path exists not only on the surface of the non-doped amorphous silicon film 40 to the gate electrode 20 side but in other parts of the amorphous silicon film 40, as shown in FIG. 4. That is, drain current cannot be fixed solely by the face resistance (channel resistance) Rch generated by the laminate layer on the surface 40a of the amorphous silicon film 40 to the gate electrode side, because of gate voltage applied between the gate electrode 20 and source electrode 50. Furthermore, the non-doped amorphous silicon film 40 of high resistance interposed between the source electrode 50 and the laminate layer on the surface 40a causes a resistance (contact resistance) Rco, resulting in a high resistance in an ON state. When the source and drain electrodes 50, 60 are made of metal material such as aluminum, they effect virtually ohmic contact with both electron and positive hole carriers. As a result, minority carriers are injected for response causing leakage current in an OFF state (low resistance in an OFF state). The leakage current can be prevented in an n-channel mode TFT in which n+ layer is interposed between the non-doped amorphous silicon film 40 and the source and drain electrodes 50, 60. In this case, it is necessary to selectively etch the non-doped and n+ amorphous silicon films. However, since these films have the same chemical property, they must be etched selectively by controlling the etching time so that parts of the films are etched away to the required thickness accurately. Meanwhile, the non-doped layer 40 must be made thin enough to obtain a TFT that has a high resistance in the OFF state, and therefore has no thickness allowance for etching. Accordingly, when a plurality of TFT's are formed over a wide area as required in an active matrix liquid crystal display unit, the thickness allowance of the non-doped layer 40 is not enough to cover fluctuation of the film thickness and etching rate. That is, selective etching is virtually impossible.

For the TFT with the structure shown in FIG. 2, the contact resistance Rco has no effect on the TFT characteristics when the non-doped amorphous silicon layer 41 is thick. When it is thin, however, a current path as shown by (b) in FIG. 5 occurs, giving a considerable effect to the TFT characteristics. Namely, fluctuation of the TFT characteristics results. In this case as well, the non-doped amorphous silicon layer 41 should be thin to obtain low resistance in the OFF state. If an n+ layer is interposed between the metal electrode 51 and the non-doped amorphous silicon layer 41 to prevent minority carrier injection, selective etching becomes necessary, though it is not possible for the same reason as that in the case of the TFT of FIG. 1.

In a TFT with the structure shown in FIG. 3, the non-doped amorphous silicon layer 42 is made in direct contact with the n+ amorphous silicon films 72, 82 on the gate insulating film 32, so that the contact resistance Rco does not influence the TFT characteristics any more. However, because of the direct contact between the non-doped amorphous silicon film 42 and the metallic source and drain electrodes 52, 62, minority carrier injection (response of positive holes) cannot be restrained by the n+ amorphous silicon layers 72, 82. The minority carrier injection can be prevented either by removing the metallic electrode 62 or by offsetting it to the extent that it does not overlap the non-doped amorphous silicon layer 42. With the latter option, it is necessary to selectively etch the non-doped amorphous silicon layer 42 and the n+ amorphous silicon layer 82. Thus, even with the structure shown in FIG. 3, it is virtually impossible to obtain a TFT with the required characteristics.

OBJECTS AND SUMMARY OF THE INVENTION

OBJECTS OF THE INVENTION

An object of the present invention is to provide a TFT with good characteristics in which the resistance is low in an ON state due to the low electrode resistance and is high in an OFF state due to the restrained minority carrier injection.

Other objects and further scope of applicability of the present invention will become apparent from the detailed description given hereinafter. It should be understood, however, that the detailed description and specific examples, while indicating preferred embodiments of the invention, are given by way of illustration only; various changes and modifications within the spirit and scope of the invention will become apparent to those skilled in the art from this detailed description.

SUMMARY OF THE INVENTION

A transistor according to the present invention comprises: a gate electrode formed on an insulating substrate; a first insulating film formed to cover said gate electrode; a first conducting semiconductor film formed on said first insulating film; a second insulating film formed to entirely cover said first semiconductor film; a pair of second conducting semiconductor layers formed spaced from each other and each made in contact with a lateral side of said first semiconductor; and a first electrode and a second electrode formed in contact with said second semiconductor layers. respectively.

In the transistor with the above construction, current flows only on the sides of the semiconductor film and through the second conducting layers. Since the semiconductor layers keep in direct contact with the side faces with low resistance of the channel, the resistance of semiconductor layers themselves (contact resistance) does not influence the resistance in the ON state, so that the transistor has a low resistance in the ON state. Moreover, since there is no current flow perpendicular to the semiconductor film, the transistor characteristics cannot fluctuate with the thickness of the semiconductor film. In addition, since the first conducting semiconductor film keeps in direct contact with the second conducting semiconductor layers, restraining injection of minority carriers, there is no leakage current in the OFF state. Accordingly, the TFT has high resistance in the OFF state.

BRIEF DESCRIPTION OF THE DRAWINGS

The present invention will be better understood from the detailed description given hereinbelow and the accompanying drawings which are given by way of illustration only, and thus are not limitative of the present invention and wherein.

DESCRIPTION OF THE PREFERRED EMBODIMENTS

Figure 6:
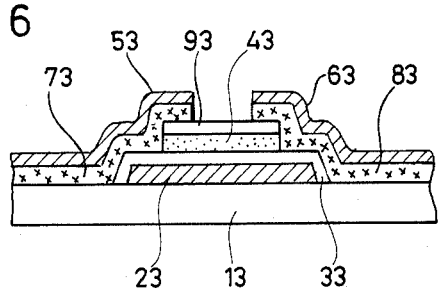
FIG. 6 is a schematic sectional veiw of an embodiment of a thin film transistor of the present invention.
Figure 7A:
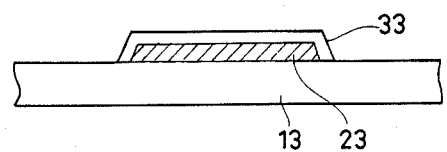
FIGS. 7(a) through 7(c) are schematic sectional views showing manufacturing steps of the thin film transistor of FIG. 6.
Figure 7B:
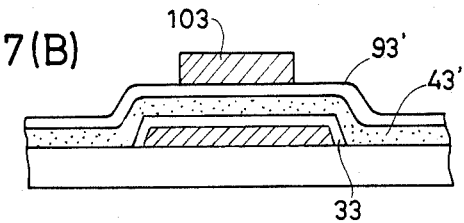
Figure 7C:
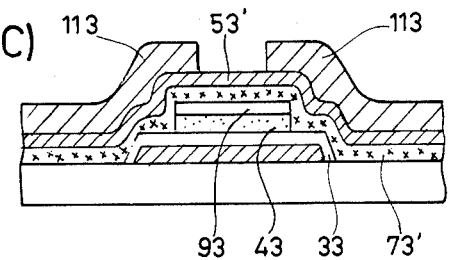

The structure of a field effect TFT of the embodiment of the present invention is shown in FIG. 6, and the manufacturing steps of the TFT of FIG. 6 are shown in FIGS. 7(a) through 7(c). Referring to FIG. 7(a), a gate electrode 23 and a gate insulating film 33 are formed in this order on an insulating substrate 13. The gate electrode 23 is made of metallic film or semiconductor such as heavily doped polysilicon, Ta, Ti, Mo, W, Ni and Cr. The gate insulating film 33 is made of $Ta_2O_5$, $Si_3N_4$, or $SiO_2$ deposited by anodic oxidation, thermal oxidation, CVD or plasma CVD process. Then, as shown in FIG. 7(b), a non-doped amorphous silicon film 43' as a first conducting semiconductor film and an $Si_3N_4$ film 93' are successively deposited by the plasma CVD process, and then photoresist pattern 103 is formed to cover only the central portion except the peripheral portion of the gate electrode 23. The film 93' may be made of $SiO_2$ instead of $Si_3N_4$ and formed by sputtering, CVD or thermal oxidation process. Then, as shown in FIG. 7(c), an amorphous silicon film 43 and an $Si_3N_4$ film 93 are formed by etching using the photoresist pattern 103. Thus, the insulating film 93 covers the entire top surface (excluding the side surfaces) of the semiconductor film 43. After the resist pattern 103 is removed, a n+ amorphous silicon layer 73' as a second conducting semiconductor film is deposited by glow discharging and, a Mo film 53' by sputtering. Then, resist patterns 113 are formed using photoresist. Finally, the Mo film 53' and the n+ amorphous silicon layer 73' are successively etched by using the resist patterns 113 to form n+ amorphous silicon layers 73, 83, a source electrode 53 and a drain electrode 63. Thus, the TFT with the structure shown in FIG. 6 is obtained.

Figure 1:
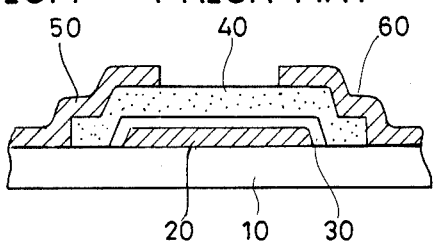
FIGS. 1 through 3 are schematic sectional veiws of thin film transistors of the prior art.
Figure 2:
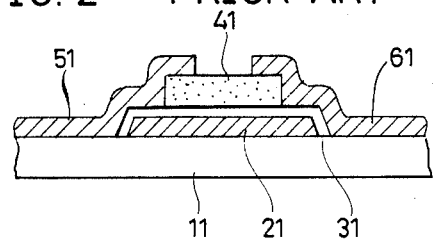
Figure 3:
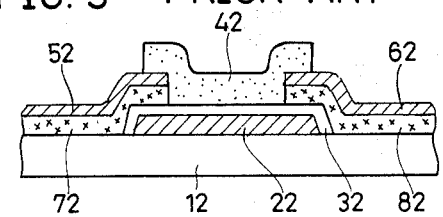
Figure 4:
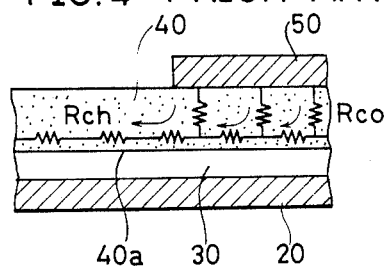
FIG. 4 is a schematic sectional veiw for explaining an operational mode of the thin film transistor of FIG. 1.
Figure 5:
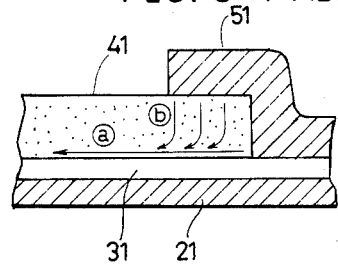
FIG. 5 is a schematic sectional view for explaining an operational mode of the thin film transistor of FIG. 2.

According to the present invention, the non-doped amorphous silicon layer 43 is protected by the insulating film 93 during the final etching process, so that selective etching is properly conducted for the non-doped amorphous silicon layer 43 and the n+ amorphous silicon layer 73'. Since current flows only in the path indicated by ⓐ in FIG. 5, fluctuation of characteristics (ON current) of the TFT becomes negligibly small. In addition, according to the present invention, the laminate layer excited by gate voltage and the n+ amorphous layers 73, 83 are kept in direct contact with the surface of the non-doped amorphous silicon layer 43 to the gate side. The contact resistance Rco at the source and drain electrodes is therefore extremely small, so that TFT has a low resistance in the ON state. Besides, since the n+ amorphous silicon layers 73, 83 are interposed each between the non-doped amorphous silicon film 43 and metallic electrodes 53, 63, positive hole injection is restrained so that the TFT has a high resistance in the OFF state. Thus, the TFT of the embodiment of the present invention is free from various problems associated with the conventional TFT's nad has such good switching characteristics that resistance is high in the OFF state while it is low in the ON state. The TFT of the present invention is extremely useful as an addressing device in an active matrix liquid crystal display unit of large display capacity.

In the above embodiment of the present invention, material of the semiconductor film is not limited to amorphous silicon. It may be made of polycrystal silicon, II-VI compound semiconductor, III-V compound semiconductor, IV-VI compound or amorphous germanium or polycrystal germanium. The non-doped amorphous silicon layer may be replaced by a ligthly doped amorphous silicon film.

As mentioned above, the present invention realizes a thin film transistor with small fluctuation of ON current characteristics and has a low resistance in the ON state and high resistance in the OFF state. Besides, selective etching is not necessary in manufacturing the thin film transistor of the present invention.

The invention being thus described, it will be obvious that the same may be varied in many ways. Such variations are not to be regarded as departure from the spirit and scope of the invention, and all such modifications are intended to be included within the scope of the following claims.

What is claimed is:

1. A thin film transistor comprising:
   a gate electrode formed on an insulating substrate, said gate electrode being the only gate electrode of the transistor;
   a first insulating film formed to cover said gate electrode;
   a first conducting semiconductor film formed on said first insulating film;
   a second insulating film disposed on the entire top surface of said first conducting semiconductor film;
   a pair of second conducting semiconductor layers formed, spaced from each other, in contact with the side surfaces of said semiconductor film and said second insulating film; and first and second electrodes formed in contact only with said pair of second conducting semiconductor layers, respectively.

2. The thin film transistor of claim 1, wherein said first conducting semiconductor film contains non-doped amorphous silicon film.

3. The thin film transistor of claim 1 wherein said gate electrode is made of a material selected from the group consisting of Ta, Ti, Mo, W, Ni and Cr.

4. The thin film transistor of claim 1 wherein said second insulating film consists of $Si_3N_4$.

5. The thin film transistor of claim 1 wherein said second insulating film consists of $SiO_2$.

6. The thin film transistor of claim 1 wherein said first conducting semiconductor film contains an amorphous silicon film lightly doped with respect to said second conducting semiconductor layer.

* * * * *